(12) United States Patent
Kim et al.

(10) Patent No.: US 10,290,692 B2
(45) Date of Patent: May 14, 2019

(54) ARRAY SUBSTRATE FOR THIN FILM TRANSISTOR AND DISPLAY DEVICE OF THE SAME

(71) Applicant: LG Display Co., Ltd., Seoul (KR)

(72) Inventors: Changeun Kim, Gunpo-si (KR); Yonggyoon Jang, Paju-si (KR); Jeongeun Baek, Seoul (KR); Sungjin Kim, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/837,353

(22) Filed: Dec. 11, 2017

(65) Prior Publication Data

US 2018/0182833 A1 Jun. 28, 2018

(30) Foreign Application Priority Data

Dec. 23, 2016 (KR) .................. 10-2016-0178302

(51) Int. Cl.
*H01L 29/08* (2006.01)
*H01L 27/32* (2006.01)
(Continued)

(52) U.S. Cl.
CPC ........ *H01L 27/3262* (2013.01); *G02F 1/1368* (2013.01); *G02F 1/136227* (2013.01); *H01L 27/1225* (2013.01); *H01L 27/1288* (2013.01); *H01L 27/283* (2013.01); *H01L 27/3246* (2013.01); *H01L 27/3248* (2013.01); *H01L 27/3274* (2013.01); *H01L 29/1033* (2013.01); *H01L 29/4908* (2013.01); *H01L 29/6675* (2013.01); *H01L 29/7869* (2013.01); *H01L 29/78681* (2013.01); *H01L 29/78696* (2013.01)

(58) Field of Classification Search
CPC ................................................. H01L 27/3262
USPC ........................................................... 257/40
See application file for complete search history.

(56) References Cited

U.S. PATENT DOCUMENTS 5,973,358 A 10/1999 Kishi
2003/0080337 A1 5/2003 Yudasaka et al.
(Continued)

FOREIGN PATENT DOCUMENTS

JP 2003-519928 A 6/2003
JP 2005-093874 A 4/2005
(Continued)

OTHER PUBLICATIONS

Extended European Search Report dated May 28, 2018 issued in corresponding European Patent Application No. 17206666.4.
(Continued)

*Primary Examiner* — Ajay Arora
(74) *Attorney, Agent, or Firm* — Morgan, Lewis & Bockius LLP

(57) ABSTRACT

A thin-film transistor array substrate and a display device are disclosed. The thin-film transistor array substrate includes a substrate, a gate electrode disposed on the substrate, an active layer, which opposites the gate electrode, has a first region and a second region having different thicknesses, and comprises at least a semiconductor material, a gate insulating film interposed between the gate electrode and the active layer, and a source electrode and a drain electrode, which are respectively in contact with the active layer.

13 Claims, 7 Drawing Sheets

(51) Int. Cl.
*H01L 29/786* (2006.01)
*H01L 29/10* (2006.01)
*G02F 1/1362* (2006.01)
*G02F 1/1368* (2006.01)
*H01L 27/12* (2006.01)
*H01L 27/28* (2006.01)
*H01L 29/49* (2006.01)
*H01L 29/66* (2006.01)

(56) References Cited

U.S. PATENT DOCUMENTS

| | | | |
|---|---|---|---|
| 2003/0147018 A1* | 8/2003 | Sano | G02F 1/13454 349/42 |
| 2011/0084252 A1 | 4/2011 | Wu et al. | |
| 2012/0007086 A1 | 1/2012 | Oh et al. | |
| 2014/0103332 A1* | 4/2014 | Ahn | H01L 29/78696 257/43 |
| 2015/0261365 A1* | 9/2015 | Hong | G06F 3/0412 345/173 |
| 2016/0334918 A1* | 11/2016 | Hu | H01L 29/78693 |

FOREIGN PATENT DOCUMENTS

| | | |
|---|---|---|
| JP | 2005-259884 A | 9/2005 |
| JP | 2006-237587 A | 9/2006 |
| JP | 2007-188923 A | 7/2007 |
| JP | 2011-082517 A | 4/2011 |
| KR | 10-2012-0004218 A | 1/2012 |
| KR | 10-2015-0040076 A | 4/2015 |

OTHER PUBLICATIONS

Office Action dated Dec. 4, 2018 issued in corresponding Japanese Patent Application No. 2017-240622.

* cited by examiner

ARRAY SUBSTRATE FOR THIN FILM TRANSISTOR AND DISPLAY DEVICE OF THE SAME This application claims the priority benefit of Korean Patent Application No. 10-2016-0178302 filed on Dec. 23, 2016, which is incorporated herein by reference for all purposes as if fully set forth herein.

BACKGROUND

Technical Field

The present disclosure relates to a thin-film transistor array substrate and a display device including the same.

Discussion of the Related Art

Recently, the importance of flat panel display (FPD) devices is increasing with the development of multimedia. Accordingly, various displays such as liquid crystal display (LCD) devices, plasma display panels (PDPs), field emission display (FED) devices, organic light emitting display (OLED) devices are put into practical use.

Methods for driving display devices include a passive matrix method and an active matrix method using a thin-film transistor. In the passive matrix method, an anode and a cathode are formed to be orthogonal to each other and a line is selected to be driven while, in the active matrix method, a thin-film transistor is connected to each pixel electrode to perform the driving according to on/off switching.

Thin-film transistors are very important not only for the basic characteristics of thin-film transistors such as electron mobility and leakage current, but also for durability and electrical reliability that can maintain a long lifetime. In particular, an active layer of the thin-film transistor may be formed mainly of amorphous silicon, polycrystalline silicon, or oxide semiconductor. Although amorphous silicon is advantageous in that the film-forming process is simple and the production cost is low, but it is disadvantageous in that the electron mobility is as low as 0.5 $cm^2/Vs$. An oxide semiconductor has an on/off ratio of about $10^8$ and a low leakage current, but it is disadvantageous in that it has an electron mobility of 10 $cm^2/Vs$, which is lower than that of polycrystalline silicon. Polycrystalline silicon has high electron mobility of about 100 $cm^2/Vs$, but it is disadvantageous in that it has a low on/off ratio compared to oxide semiconductor and it is expensive to apply it to a large area. Accordingly, studies for improving characteristics of the thin-film transistors such as electron mobility, leakage current, on/off ratio, etc., are being continued.

SUMMARY

Accordingly, embodiments of the present disclosure are directed to an array substrate for a thin film transistor and display device of the same that substantially obviate one or more of the problems due to limitations and disadvantages of the related art.

An aspect of the present disclosure is to provide a thin-film transistor array substrate, which can improve the device characteristics by forming active layers having different channel thicknesses and a display device including the same.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described, a thin-film transistor array substrate comprises a substrate, a gate electrode disposed on the substrate, an active layer, which opposites the gate electrode, has a first region and a second region having different thicknesses, and comprises at least a semiconductor material, a gate insulating film interposed between the gate electrode and the active layer, and a source electrode and a drain electrode, which are respectively in contact with the active layer.

The thickness of the first region is smaller than that of the second region.

The active layer comprises a channel region, and the first and second regions completely overlap with the channel region.

The first region is adjacent to any one selected from the source electrode and the drain electrode, and the second region is adjacent to the another selected from the source electrode and the drain electrode.

The thickness of the first region is in a range of 3 nm to 10 nm.

The thickness of the second region is 1.5 times to 3 times of the thickness of the first region.

The length of the second region is 50% to 90% based on that of the channel region.

The active layer further comprises a plurality of carbon allotropes and the carbon allotropes are dispersed in the semiconductor material.

The carbon allotropes have a one-dimensional structure or two-dimensional structure.

The carbon allotrope is one selected from the group consisting of reduced graphene oxide (rGO), non-oxidized graphene, graphene nanoribbon, carbon nanotube (CNT), or a mixture thereof.

The semiconductor material is one selected from the group consisting of a ceramic semiconductor, an organic semiconductor, a transition metal chalcogenide, and an oxide semiconductor, or a mixture thereof.

The carbon allotropes in the first active layer are comprised in an amount of 0.01 wt % to 1 wt % based on 100 wt % of the semiconductor material.

In another aspect, a display device comprises a substrate, a gate electrode disposed on the substrate, an active layer, which opposites the gate electrode, has a first region and a second region having different thicknesses, and comprises at least a semiconductor material, a gate insulating film interposed between the gate electrode and the active layer, a source electrode and a drain electrode, which are respectively in contact with the active layer, an organic insulating film, which is disposed on the source electrode and the drain electrode, and a pixel electrode disposed on the organic insulating film.

The active layer further comprises a plurality of carbon allotropes and the carbon allotropes are dispersed in the semiconductor material.

The display device further comprises an organic light emitting diode electrically connected to the pixel electrode, an encapsulation layer disposed on the organic light emitting diode, and a cover window disposed on the encapsulation layer.

The display device further comprises a common electrode, which is disposed to be spaced apart from the pixel electrode on the same plane or a lower part thereof, and a liquid crystal layer disposed on the common electrode.

It is to be understood that both the foregoing general description and the following detailed description are exemplary and explanatory and are intended to provide further explanation of the inventive concepts as claimed.

BRIEF DESCRIPTION OF THE DRAWINGS

In the accompanying drawings, which are included to provide a further understanding of the disclosure and are incorporated and constitute a part of this application, illustrate embodiments of the disclosure and together with the description serve to explain various principles. In the drawings.

DETAILED DESCRIPTION

Figure 1:
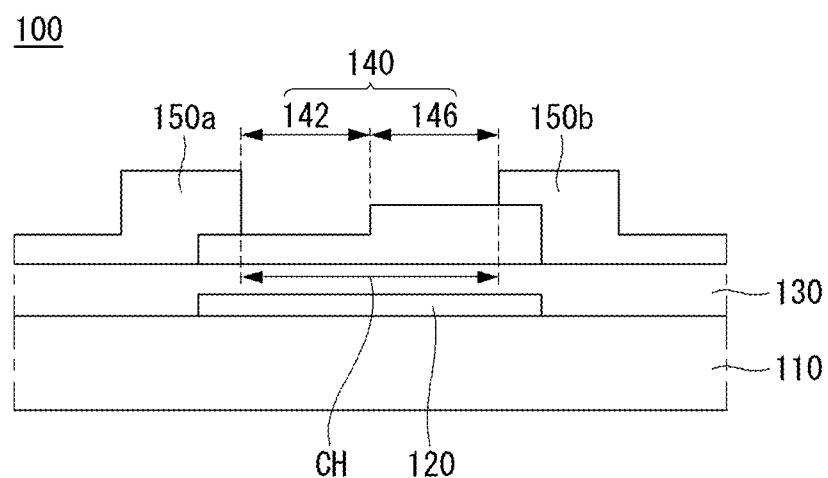
FIGS. 1 and 2 show cross-sectional views of a thin-film transistor array substrate according to exemplary embodiments of the present disclosure.

Hereinafter, exemplary embodiments of the present disclosure will be described in detail with reference to illustrative drawings. In adding reference numerals to the constituent elements of the drawings, it should be noted that throughout the specification the same constituting elements are denoted by the same reference symbols as possible even if they are displayed on different drawings, like reference numerals denote substantially like components. Additionally, in explaining the exemplary embodiments of the present disclosure, if it is determined that the detailed description with regard to known functions or configurations related to the invention may obscure the gist of the invention, detailed description thereof will be omitted.

In explaining the constituent elements of the invention, terms such as a first, a second, A, B, (a), and (b) may be used. These terms are intended to distinguish the constituent elements from other constituent elements, and the nature, order, sequence, etc., of the constituent elements are not limited by these terms. When a constituent element is described as being "linked", "coupled", or "connected" with another constituent element, it may be understood that the constituent element is directly linked, coupled, or connected to the different constituent element, but it may also be understood that the different constituent element is linked, coupled, or connected between each of the constituent elements. In the same context, when a constituent element is described as being formed "on" or "below" of a different constituent element, it should be understood to include a case where the constituent element is directly formed on the different constituent element and a case where the constituent element is indirectly formed by interposing an another different constituent element to the different constituent element.

The display device according to the present disclosure described below may be an organic light emitting display device, a liquid crystal display device, an electrophoretic display device, etc. In the present disclosure, the liquid crystal display device is described as an exemplary embodiment. The liquid crystal display consists of a thin-film transistor array substrate, in which a pixel electrode and a common electrode are formed on a thin-film transistor, a color filter substrate, and a liquid crystal layer interposed between the two substrates. In such a liquid crystal display device, the liquid crystal is driven by an electric field that is vertically or horizontally applied to the common electrode and the pixel electrode. The display device according to the present disclosure may also be used in an organic light emitting display device. For example, the organic light emitting display device includes a first electrode and a second electrode connected to a thin-film transistor, and a light emitting layer, made of an organic material, disposed therebetween. Therefore, the holes supplied from the first electrode and the electrons supplied from the second electrode are combined in the light emitting layer to form excitons, which are hole-electron pairs, and the excitons emit light by energy generated as they return to the ground state. The active layer containing the carbon allotrope of the present disclosure described below may be used in the thin-film transistor of the above-described display device.

Hereinafter, exemplary embodiments of the present disclosure will be described with reference to the accompanying drawings.

The present disclosure discloses a thin-film transistor which includes a semiconductor material alone or a thin-film transistor which further includes a carbon allotrope, and discloses a thin-film transistor in which an active layer including regions of different thickness is formed. The thin-film transistor is used as a switching element or a driving element of a display device.

Semiconductor Material

The active layer of the present disclosure includes a semiconductor material. The semiconductor material to be used in the present disclosure may be a ceramic semiconductor, an organic semiconductor, a transition metal chalcogenide or oxide semiconductor that can be coated with a solution.

The ceramic semiconductor utilizes the electrical properties of ceramics. Since ceramics are bound to certain ions or atoms, they cannot move freely and are thus hardly electrified. However, when an electric field is applied from the outside, the electrons can move due to the rearrangement of the bound electrons in response to the change of state. A ceramic semiconductor is composed of oxides, carbides, and nitrides prepared by the binding between metal elements such as silicon (Si), germanium (Ge), selenium (Se), aluminum (Al), titanium (Ti), zirconium (Zr), etc., and oxygen (O), carbon (C), nitrogen (N), etc. A typical ceramic semiconductor may include barium titanate ($BaTiO_3$).

The organic semiconductor is an organic compound having semiconductor characteristics and may include polymeric organic semiconductors or low-molecular organic semiconductors. Examples of the polymeric organic semiconductors may include poly[(9,9-dioctylfluorenyl-2,7-diyl)-co-bithiophene] (F8T2), poly[(5,6-dihydro-5-octyl-4,6-dioxo-4H-thieno[3,4-C]pyrrole-1,3-diyl){4,8-bis[(2-butyloctyl)oxy]benzo[1,2-b:4,5-b']dithiophene-2,6-diyl}] (PBDTBOTPDO), poly[[5-(2-ethylhexyl)-5,6-dihydro-4,6-dioxo-4H-thieno[3,4-c]pyrrole-1,3-diyl][4,8-bis[(2-ethylhexyl)oxy]benzo[1,2-b:4,5-b]' dithiophene-2,6-diyl]] (PBDT-TPD), poly[1-(6-{4,8-bis[(2-ethylhexyl)oxy]-6-methylbenzo[1,2-b:4,5-b']dithiophen-2-yl}-3-fluoro-4-methylthieno[3,4-b]thiophen-2-yl)-1-octanone] (PBDTTT-CF), poly[N-9'-heptadecanyl-2,7-carbazole-alt-5,5-(4',7'-di-2-thienyl-2',1',3'-benzothiadiazole) (PCDTBT), poly[[9-(1-octylnonyl)-9H-carbazole-2,7-diyl]-2,5-thiophenediyl-2,1,3-benzothiadiazole-4,7-diyl-2,5-thiophenediyl]), poly[2,6-(4,4-bis-(2-ethylhexyl)-4H-cyclopenta[2,1-b;3,4-b']dithiophene)-alt-4,7(2,1,3-benzothiadiazole)] (PCPDTBT), poly[2,7-(9,9-dioctylfluorene)-alt-4,7-bis(thiophen-2-yl)benzo-2,1,3-thiadiazole] (PFO-DBT), poly[bis(4-phenyl)(2,4,6-trimethylphenyl)amine] (PTAA), poly[(5,6-dihydro-5-octyl-4,6-dioxo-4H-thieno[3,4-c]pyrrole-1,3-diyl)[4,8-bis[(2-ethylhexyl)oxy]benzo[1,2-b:4,5-b']dithiophene-2,6-diyl]], poly[(9,9-di-n-octylfluorenyl-2,7-diyl)-alt-(benzo[2,1,3]thiadiazol-4,8-diyl)] (F8BT), poly(3-dodecylthiophene-2,5-diyl) (P3DDT), poly(3-hexylthiophene-2,5-diyl) (P3HT), poly[2-methoxy-5-(3',7'-dimethyloctyloxy)-1,4-phenylenevinylene] (MDMOPPV), poly[2-methoxy-5-(2-ethylhexyloxy)-1,4-phenylenevinylene] (MEH-PPV), poly(3-octylthiophene-2,5-diyl) (P3OT), and poly({4,8-bis[(2-ethylhexyl)oxy]benzo[1,2-b:4,5-b]dithiophene-2,6-diyl}{3-fluoro-2-[(2-ethylhexyl)carbonyl]thieno[3,4-b]thiophenediyl}) (PTB7), etc.

The low-molecular organic semiconductors may include, for example, 6,13-bis(triisopropylsilylethynyl)pentacene (TIPS-pentacene), 6,13-bis((triethylsilyl)ethynyl)pentacene (TESPentacene), 5,5'-bis(7-hexyl-9H-fluoren-2-yl)-2,2'-bithiophene (DH-FTTF), 2,8-difluoro-5,11-bis(triethylsilylethynyl)anthradithiophene (diF-TES-ADT), 5,5'-dihexyl-2,2'-bithiophene (DH2T), 3,3'''-dihexyl-2,2':5',2'':5'',2'''-quaterthiophene (DH4T), 5,5'''''-dihexyl-2,2':5',2'':5'',2''':5''',2'''':5'''',2'''''-sexithiophene (DH6T), 2(4,4'-[4,4-bis(2-ethylhexyl)-4H-silolo[3,2-b:4,5-b']dithiophene-2,6-diyl]bis[7-(5'-hexyl-[2,2'-bithiophen]-5-yl)-[1,2,5]thiadiazolo[3,4-c]pyridine], 5,5'-bis{[4-(7-hexylthiophen-2-yl)thiophen-2-yl]-[1,2,5]thiadiazolo[3,4-c]pyridine}-3,3'-di-2-ethylhexylsilylene-2,2'-bithiophene) (DTS(PTTh2), 2,5-di-(2-ethylhexyl)-3,6-bis-(5''-n-hexyl-[2,2':5',2'']terthiophen-5-yl)-pyrrolo[3,4-c]pyrrole-1,4-dione (SMDPPEH), 5,11-bis(triethylsilylethynyl)anthradithiophene (TES-ADT), etc.

As the above-described organic semiconductors, at least two kinds selected from polymeric organic semiconductors and low-molecular organic semiconductors may be used, or mutually different polymeric organic semiconductors may be used, or mutually different low-molecular organic semiconductors may be used.

The transition metal dichalcogenide is a material having semiconductor characteristics and may include transition metal sulfides, transition metal selenides, transition metal tellurides, etc. As the transition metal dichalcogenide, for example, $SnSe_2$, $CdSe$, $ZnSe$, $ZnTe$, $MoS_2$, $MoSe_2$, $MoTe_2$, $WS_2$, $WSe_2$, $WTe_2$, etc., may be used.

The oxide semi-conductor is a material having semiconductor characteristics and may be an oxide containing a metal such as gallium (Ga), indium (In), zinc (Zn), tin (Sn), silicon (Si), zirconium (Zr), etc. Examples of the oxide semiconductor to be used may include IGZO, $In_2O_3$, ZnO, IZO, IGO, etc., but is not limited thereto and known materials may be used.

Carbon Allotrope

The active layer of the present disclosure further includes carbon allotropes dispersed in the above-described semiconductor material.

The carbon allotrope disclosed in the present disclosure represents a polycyclic aromatic molecule having carbon atoms covalently bonded to each other. The covalently-bonded carbon atoms may form a 6-membered ring as a repeating unit, and additionally, may also include at least one selected from a 5-membered ring and a 7-membered ring. A carbon allotrope may be a single layer or it may include multiple carbon allotrope layers stacked on a different layer of a carbon allotrope. A carbon allotrope may have a one- or two-dimensional structure. A carbon allotrope has a maximum thickness of about 10 nm, specifically from about 1 nm to about 9 nm, and more specifically from about 2 nm to about 8 nm.

A carbon allotrope may be manufactured largely by four different methods such as physical exfoliation, chemical vapor deposition, chemical exfoliation, and epitaxial growth. Physical exfoliation is a method of attaching a scotch tape to a graphite sample and then removing it so as to obtain a carbon allotrope sheet detached from graphite on the surface of the scotch tape. Chemical vapor deposition is a method for growing crystalline allotropes of carbon by absorbing/decomposing carbon precursors in gas or vapor form with high kinetic energy on the surface of a substrate, where the crystalline allotropes of carbon are intended to be grown, so as to separate carbon atoms and establishing the formation of atomic bonds between the corresponding carbon atoms. Chemical exfoliation utilizes the oxidation-reduction characteristics of graphite and the graphite is added into a mixture of sulfuric acid and nitric acid and carboxyl compounds are attached to the edges of carbon allotrope plates. The resultant is converted to an acid chloride by chlorinated thinol and then again formed into a carbon allotrope amide using octadecylamine. When the carbon allotrope amide is recovered using a solution such as tetrahydrofuran, there occurs pulverization and individual carbon allotrope sheets are obtained. Epitaxial growth is a method for obtaining carbon allotropes by heating silicon carbide (SiC) at a high temperature of 1,500° C. and thereby silicon (Si) is removed and carbon allotropes are obtained by the remaining carbons.

The carbon allotrope to be used in the present disclosure may include reduced graphene oxide (rGO), non-oxidized graphene, graphene nanoribbon, carbon nanotube (CNT), etc. Reduced graphene oxide (GO) is a reduced form of graphene oxide, and reduced graphene oxide can be prepared by reducing graphene oxide, which is prepared by adding a strong acid to graphite to be oxidized and chemically formed into small particles. Non-oxidized graphene refers to a carbon allotrope which is prepared by a method among the above-described methods for preparing a carbon allotrope, other than the oxidation-reduction process. Graphene nanoribbons are prepared by cutting graphene in the form of a ribbon with a nanometer width and have a constant energy bandgap according to their width. The graphene nanoribbons may be synthesized from monomers containing a carbon allotrope or by cutting carbon nanotubes and spreading them into planes. In addition to the above-described types of carbon allotropes, known carbon allotrope structures such as graphene nanomesh, etc., may be used for the carbon allotrope of the present disclosure.

The carbon allotrope of the present disclosure is used in the form of a flake. Carbon allotrope flakes may be prepared by coating a dispersion, in which carbon allotropes are dispersed in a solvent, on a substrate, drying the solvent, and applying a physical force thereto. As a method of applying the physical force, a carbon allotrope flake may be obtained by a method such as a ball mill, a bead mill, an ultrasonic homogenizer, and stirring.

Carbon Allotrope-Semiconductor Material Mixture

When the active layer of the present disclosure includes carbon allotropes and a semiconductor material, a carbon allotropes-semiconductor material mixture may be prepared by mixing the carbon allotropes and the semiconductor material.

More specifically, a carbon allotrope flake and a semiconductor material are prepared. The carbon allotrope flake and semiconductor material may be prepared in the form of powder. The carbon allotrope flake and semiconductor material are mixed after adding them into a solvent to produce a carbon allotrope-semiconductor mixture. Unlike the foregoing, the carbon allotrope-semiconductor mixture of the present disclosure may be prepared by mixing a carbon allotrope dispersion in which carbon allotropes are dispersed in a semiconductor solution containing a semiconductor material.

In particular, the solvent to be used may be at least one selected from the group consisting of water; alcohols selected from ethanol, methanol, isopropyl alcohol, butanol, 2-ethylhexyl alcohol, methoxypentanol, butoxyethanol, ethoxyethoxy ethanol, butoxyethoxy ethanol, methoxypropoxy propanol, texanol, terpineol, and a combination thereof; tetrahydrofuran (THF); glycerol, ethylene glycol, triethylene glycol, polyethylene glycol, propylene glycol, dipropylene glycol, dihexylene glycol, or alkyl ethers thereof; glycerin, N-methyl-2-pyrrolidinone (NMP), 2-pyrrolidone, acetylacetone, 1,3-dimethylimidazolinone, thiodiglycol, dimethyl sulfoxide (DMSO), N,N-dimethyl acetamide (DMAc), dimethylformamide (DMF), sulfolane, diethanolamine, triethanolamine, and a combination thereof.

For good dispersion of the carbon allotrope, other additives may be added or ultrasonic waves may be radiated thereto. When irradiating the carbon allotrope-semiconductor composition with ultrasonic waves, it is preferable to radiate ultrasonic waves in several times at intervals. For example, the carbon allotrope and the semiconductor material are mixed and irradiated with strong ultrasonic waves (about 250 W) for about 30 minutes with an ultrasonic crusher. By repeating such a process, the carbon allotrope-semiconductor composition with well dispersed carbon allotropes can be prepared.

The carbon allotrope to be used in the carbon allotrope-semiconductor composition of the present disclosure may be contained in an amount between 0.01 wt % and 1 wt % based on 100 wt % of the semiconductor material solids. In particular, when a content of the carbon allotrope is equal to or greater than 0.01 wt % based on 100 wt % of the semiconductor material solids, the charge mobility can be improved, whereas when a content of the carbon allotrope is equal to or less than 1 wt % based on 100 wt % of the semiconductor material solids, the effect of preventing the on-off ratio from being lowered can be exhibited.

Hereinafter, the thin-film transistor including an active layer using the above-described materials and a display device thereof will be described. An active layer made of a carbon allotrope-semiconductor material mixture is described as an example, but active materials made of the above-described materials may also be applied.

Figure 2:
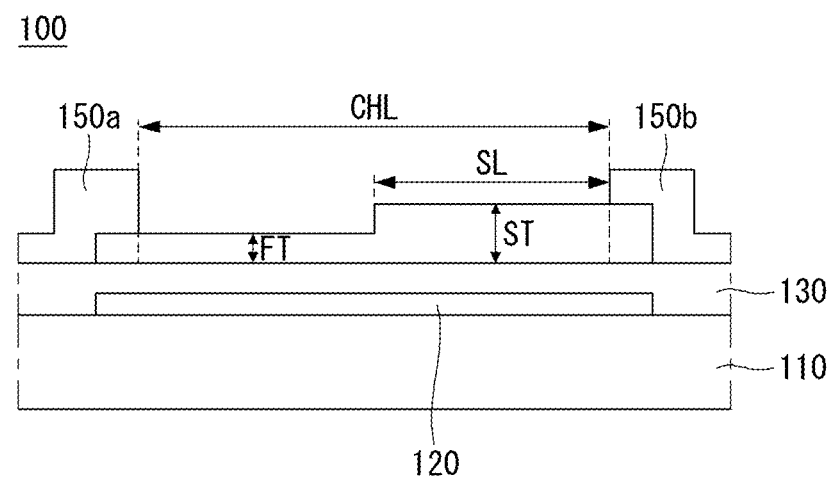
Figure 3:
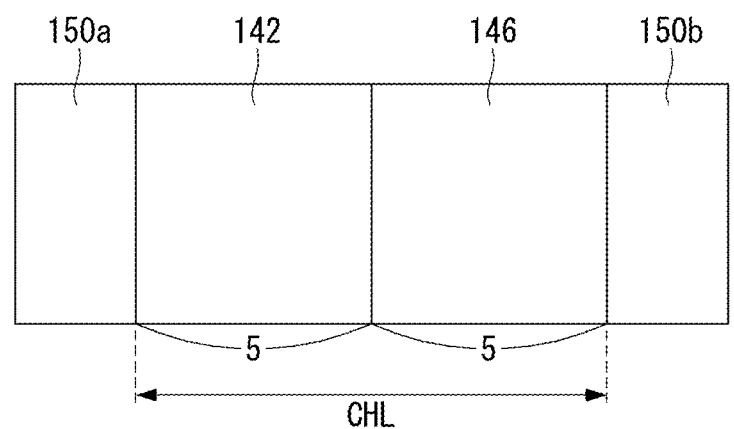
FIGS. 3 to 5 show plan views illustrating an active layer according to exemplary embodiments of the present disclosure.
Figure 4:
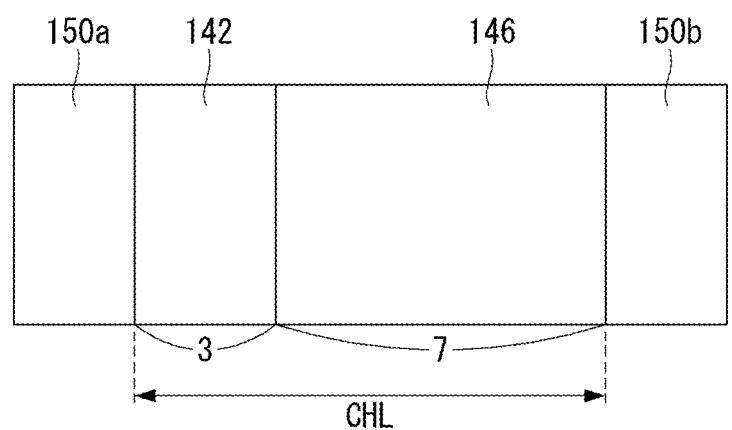
Figure 5:
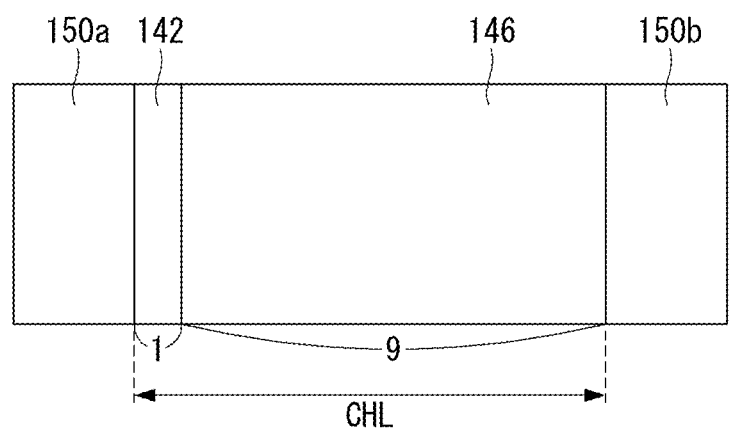
Figure 6:
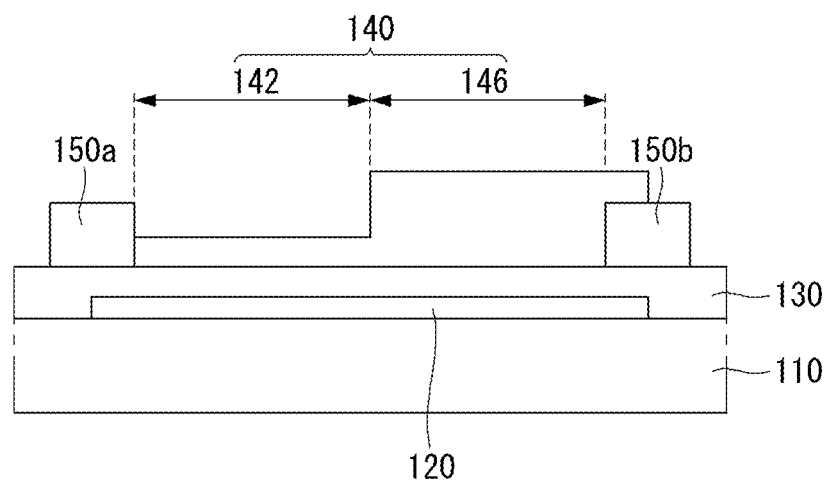
FIGS. 6 to 8 show cross-sectional views illustrating various structures of a thin-film transistor array substrate according to exemplary embodiments of the present disclosure.
Figure 7:
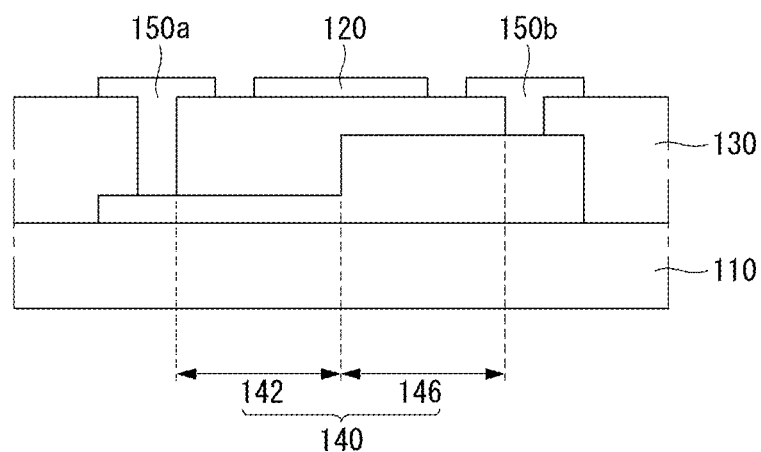
Figure 8:
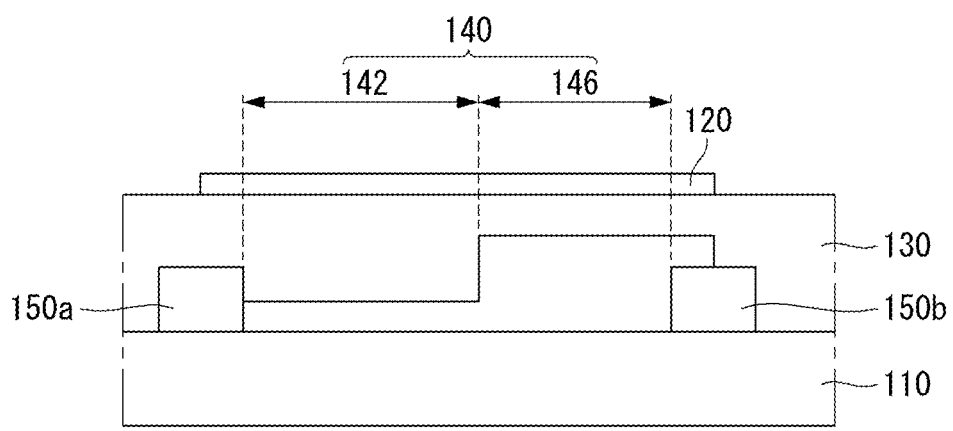

FIGS. 1 and 2 show cross-sectional views of a thin-film transistor array substrate according to exemplary embodiments of the present disclosure; FIGS. 3 to 5 show plan views illustrating an active layer according to exemplary embodiments of the present disclosure; and FIGS. 6 to 8 show cross-sectional views illustrating various structures of a thin-film transistor array substrate according to exemplary embodiments of the present disclosure.

Thin-Film Transistor Array Substrate

The thin-film transistor array substrate disclosed in the present disclosure is explained using a bottom-gate type thin-film transistor in which a gate electrode is disposed under an active layer as an exemplary embodiment.

Referring to FIG. 1, a gate electrode 120 is disposed on a substrate 110. The substrate 110 is made of a transparent or opaque glass, plastic, or metal. The gate electrode 120 may be formed of a single layer or multiple layer of any one selected from the group consisting of copper (Cu), molybdenum (Mo), aluminum (Al), chromium (Cr), gold (Au), titanium (Ti), nickel (Ni), neodymium (Nd), tantalum (Ta), and tungsten (W), or an alloy thereof. The gate insulating film 130 is disposed on the gate electrode 120 for insulating the gate electrode 120. The gate insulating film 130 is formed of a silicon oxide film ($SiO_x$), a silicon nitride film ($SiN_x$), or a multilayer thereof.

The active layer 140 is disposed on the gate insulating film 130. The active layer 140 is made of the above-described semiconductor material, carbon allotropes, or a mixture thereof. The active layer 140 of the present disclosure includes a first region 142 and a second region 146 having different thicknesses. The first region 142 is thinner than the second region 146 and the second region 146 is thicker than the first region 142. That is, the thin region in the active layer 140 corresponds to the first region 142 and the thick region in the active layer 140 corresponds to the second region 146.

The active layer 140 includes a channel region (CH). The channel region (CH) means the space between a source electrode 150a and a drain electrode 150b among the active layer 140 that overlaps the gate electrode 120. The first region 142 and the second region 146 of the active layer 140 correspond to a region that fully overlaps with the channel region (CH). That is, the first region 142 does not overlap with the source electrode 150a (or the drain electrode 150b) and the second region 146 does not overlap with the drain electrode 150b (or the source electrode 150a). In the present disclosure, the first region 142 is shown to be adjacent to the source electrode 150a, but is not limited thereto, and the second region 146 may be adjacent to the source electrode 150a.

The channel region (CH) is formed in the first region 142 of the active layer 140. Since the thickness is relatively thin, the electron concentration is distributed relatively narrowly and the effective channel length is relatively short. Thus, the first region 142 can move the threshold voltage (Vth) in the positive direction. Additionally, when a plurality of carbon allotropes are included in the first region 142 of the active layer 140, a plurality of carbon allotropes can increase the electron mobility by allowing carriers to rapidly move through the carbon allotropes.

The channel region (CH) is formed in the second region 146 of the active layer 140. Since the thickness is relatively thick, the electron concentration is distributed relatively widely and the effective channel length is relatively long. Thus, the second region 146 can increase the electron mobility and prevent the threshold voltage (Vth) from moving in the negative direction. Additionally, when a plurality of carbon allotropes are included in the second region 146 of the active layer 140, a plurality of carbon allotropes can increase the electron mobility by allowing carriers to rapidly move through the carbon allotropes.

Therefore, the active layer 140 of the present disclosure is advantageous in that it includes the first region 142 having a small thickness and the second region 146 having a large thickness, thereby increasing the electron mobility and preventing the threshold voltage from moving in the negative direction.

Referring to FIG. 2, the thickness of the first region 142 (FT) of the active layer 140 of the present disclosure may be in a range between 3 nm and 10 nm. When the thickness of the first region 142 (FT) is 3 nm or more, the channel region (CH) may be form to have a reduced thickness to prevent the decrease of electron mobility, whereas when the thickness of the first region 142 (FT) is 10 nm or less, the active layer 140 can be prevented from becoming thick. The thickness (ST) of the second region 146 of the active layer 140 of the present disclosure may be 1.5 times to 3 times the thickness of the first region 142 (FT). When the thickness of the second region 146 (ST) is 1.5 times or higher the thickness of the first region 142 (FT), carriers can be supplied to the channel region (CH) to increase the electron mobility, whereas when the thickness of the active region 146 (ST) is 3 times or less than the thickness of the first region 142 (FT), the active layer 146 can be prevented from becoming thick.

Meanwhile, the length of the second region 146 (SL) of the active layer 140 of the present disclosure may be formed in a range of 50% to 90% based on the length (CHL) of the channel region (CH). When the length of the second region 146 (SL) is equal to or greater than 50% based on the length (CHL) of a channel region (CH), the electron concentration can be increased by optimizing the electron concentration in the channel region (CH), whereas when the length of the second region 146 (SL) is equal to or less than 90% based on the length (CHL) of the channel region (CH), it can prevent the threshold voltage (Vth) from moving in the negative direction.

Accordingly, as shown in FIG. 3, the length of the second region 146 (SL) of the active layer 140 may be formed at least in a 5:5 ratio based on the length (CHL) of the channel region (CH). Preferably, as shown in FIG. 4, the length of the second region 146 (SL) of the active layer 140 may be formed at least in a 7:3 ratio based on the length (CHL) of the channel region (CH). However, as shown in FIG. 5, it is preferred that the length of the second region 146 (SL) of the active layer 140 be not exceeding at least a 9:1 ratio based on the length (CHL) of the channel region (CH).

When the active layer 140 of the present disclosure includes a semiconductor material and carbon allotropes, the active layer 140 may include carbon allotropes in the first region 142 and the second region 146 in an amount of 0.01 wt % to 1 wt % based on 100% of the semiconductor material. In particular, when the content ratio of carbon allotropes is equal to or greater than 0.01% based on 100 wt % of the semiconductor material, the electron mobility of the active layer may be improved, whereas when the content ratio of carbon allotropes is equal to or less than 1 wt % based on 100 wt % of the semiconductor material, the threshold voltage of the transistor can be prevented from moving in the negative (−) direction. For reference, 100 wt % of the semiconductor material means 100 wt % of semiconductor material solids, and refers to the wt % of the carbon allotropes solids based on 100 wt % of the semiconductor material solids.

The above-described active layer 140 may be formed by coating the above-described mixture of the carbon allotropes and the semiconductor material twice on the substrate 110 on which the gate insulating film 130 is formed so as to form the first region 142 and the second region 146. Exemplary methods for coating the carbon allotrope-semiconductor composition may include spin coating, slit coating, screen printing, ink-jet printing, etc., and any method may be used as long as it involves coating a solution. The solvent is removed by heating the carbon allotrope-semiconductor thin-film at 250° C. for 2 hours. Then, the active layer 140 of the present disclosure may be prepared by patterning the carbon allotrope-semiconductor thin-film via photolithography method. For example, an active layer including the first region 142 and the second region 146 having different thicknesses may be formed by forming the pattern of an active layer having a predetermined thickness as a first coating and further forming the pattern of an active layer having a predetermined thickness on the pattern of the active layer as a second coating. However, the present disclosure is not limited thereto and an active layer having different thicknesses may be formed by a single coating using a half-tone mask.

A source electrode 150a, which comes in contact with one side of the active layer 140, and a drain electrode 150b, which comes in contact with contact with the other side of the active layer 140, are disposed on the active layer 140. The source electrode 150a and the drain electrode 150b may be formed of a single layer or multiple layer. When the source electrode 150a and drain electrode 150b are formed of a single layer, they may be made of any one selected from the group consisting of molybdenum (Mo), aluminum (Al), chromium (Cr), gold (Au), titanium (Ti), nickel (Ni), neodymium (Nd), and copper (Cu), or an alloy thereof. Additionally, when the source electrode 150a and drain electrode 150b are formed of a multiple layer, they may be formed of a double layer of molybdenum/aluminum-neodymium, molybdenum/aluminum, or titanium/aluminum, or a triple layer of molybdenum/aluminum-neodymium/molybdenum, molybdenum/aluminum/molybdenum, or titanium/aluminum/titanium.

A thin first region may be formed in the channel region (CH) of the active layer 140 of the present disclosure to prevent the threshold voltage from moving in the negative direction, and a thick second a region may be formed thereby improving the electron mobility. Accordingly, the electron mobility and the threshold voltage can be controlled by forming the active layer 140 such that the channel region (CH) has a different thickness.

In the above-described active layer 140 of the present disclosure, when a voltage is applied to the source electrode 150a and drain electrode 150b by dispersing the carbon allotropes in a semiconductor material, electrons and holes move to the channel of the active layer 140. In particular, since the carbon allotropes are dispersed in the channel of the active layer 140, electrons and holes move according to the charge mobility of a semiconductor material in the semiconductor material, and move very rapidly in the carbon allotropes disposed close to the conductor. As electrons and holes move along the semiconductor and carbon allotropes, the electron mobility can be improved significantly. In particular, while semiconductor materials have a characteristic that electron mobility decreases due to scattering, which is a phenomenon that occurs during electron movement, scattering rarely occurs within carbon allotropes thus the risk of a decrease in electron mobility can be eliminated.

Additionally, since the active layer 140 of the present disclosure contains a small amount of carbon allotropes, there is formed almost no path, through which carriers move, by a contact (or a chemical bonding) between carbon allotropes. Accordingly, the increase in an OFF current due to deterioration of the semiconductor characteristics of the active layer 140 can be prevented.

Meanwhile, the thin-film transistor array substrate of the present disclosure may have various structures with regard to the thin-film transistors.

Referring to FIG. 6, the thin-film transistor array substrate of the present disclosure is formed to have a bottom-gate type structure in which the source electrode 150a and the drain electrode 150b may be disposed between the active layer 140 and the gate insulating film 130. More specifically, the gate electrode 120 is disposed on the substrate 110 and the gate insulating film 130 is disposed on the gate electrode 120. The source electrode 150a and drain electrode 150b spaced apart from each other may be disposed on the gate insulating film 130, and the active layer 140 may be disposed to come in contact with the source electrode 150a and drain electrode 150b on the gate insulating film 130. In particular, the active layer 140 may be arranged such that the first region 142 is disposed adjacent to the source electrode 150a while the second region 146 is disposed adjacent to the drain electrode 150b. Accordingly, the channel region (CH) of the active layer 140 is allowed to form to have a different thickness.

Additionally, referring to FIG. 7, the thin-film transistor array substrate of the present disclosure, being comprised of a top-gate structure, is characterized in that the gate electrode 120, the source electrode 150a, and the drain electrode 150b may be disposed on the gate insulating film 130. More specifically, the active layer 140 is disposed on the substrate 110 and the gate insulating film 130 is disposed on the active layer 140. The source electrode 150a and the drain electrode 150b spaced apart from each other may be disposed on the gate insulating film 130 and to be in contact with the active layer 140, and the gate electrode 120 may be interposed between the source electrode 150a and the drain electrode 150b. In particular, the active layer 140 may be arranged such that the first region 142 is disposed adjacent to the source electrode 150a while the second region 146 is disposed adjacent to the drain electrode 150b. Accordingly, the channel region (CH) of the active layer 140 is allowed to form to have a different thickness.

Additionally, referring to FIG. 8, the thin-film transistor array substrate of the present disclosure, being comprised of a top-gate structure, is characterized in that the source electrode 150a and the drain electrode 150b may be disposed under the active layer 140. More specifically, the source electrode 150a and the drain electrode 150b, which are spaced apart from each other, may be disposed on the substrate 110 and the active layer 140 may be disposed to be in contact with the source electrode 150a and the drain electrode 150b on the source electrode 150a and the drain electrode 150b. The gate insulating film 130 may be disposed on the active layer 140 and the gate electrode 120 may be disposed on the gate insulating film 130. In particular, the active layer 140 may be arranged such that the first region 142 is disposed adjacent to the source electrode 150a while the second region 146 is disposed adjacent to the drain electrode 150b. Accordingly, the channel region (CH) of the active layer 140 is allowed to form to have a different thickness.

Figure 9:
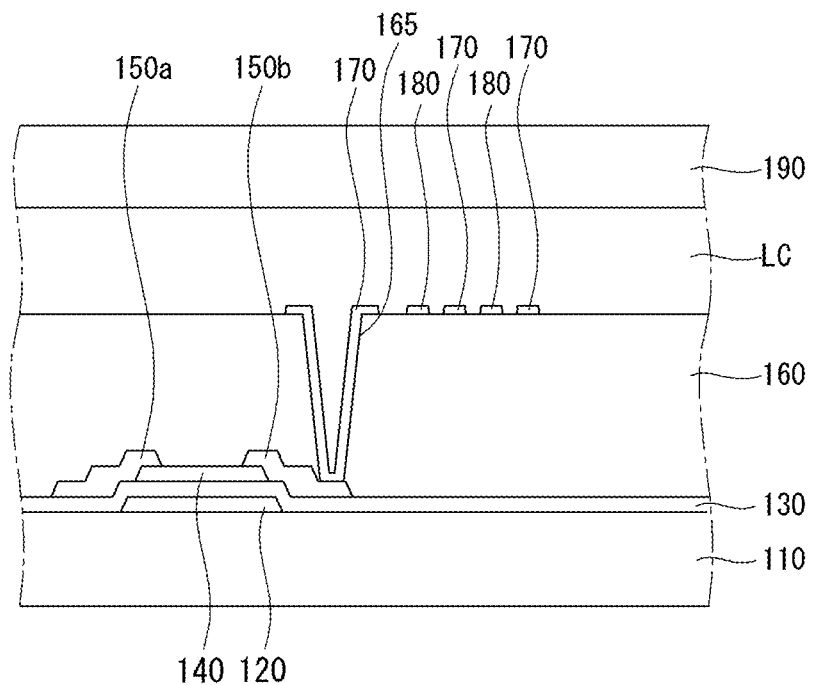
FIG. 9 shows a cross-sectional view of a liquid crystal display device according to an exemplary embodiment of the present disclosure.

Hereinafter, a display device including the thin-film transistor array substrate of the present disclosure will be described with reference to FIGS. 9 and 10. A display device including a thin-film transistor array substrate according to the above-described embodiment will be disclosed below and any duplicate description will be omitted. FIG. 9 shows a cross-sectional view illustrating a liquid crystal display device according to an exemplary embodiment of the present disclosure and FIG. 10 shows a cross-sectional view illustrating an organic light emitting display device according to an exemplary embodiment of the present disclosure.

Display Device

Figure 10:
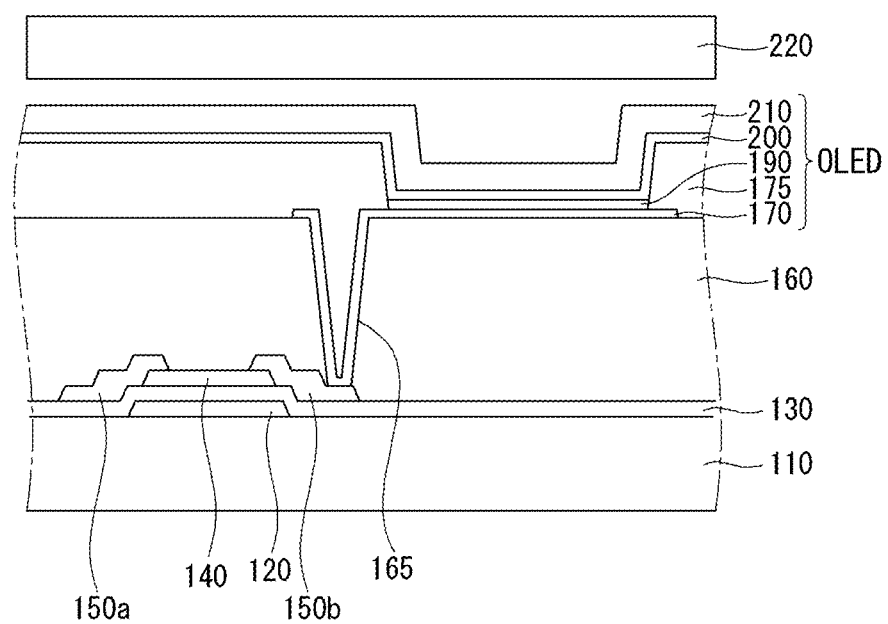
FIG. 10 shows a cross-sectional view of an organic light emitting display device according to an exemplary embodiment of the present disclosure.

Referring to FIG. 10, an organic insulating film 160 is disposed on the source electrode 150a and the drain electrode 150b. The organic insulating film 160 is for planarizing irregularities beneath it and may be made of an organic material such as photoacryl, polyimide, benzocyclobutene resin, acrylate resin, etc. The organic insulating film 160 includes a via hole 165 exposing the drain electrode 150b. Although not shown, a passivation film made of silicon oxide ($SiO_x$), silicon nitride (SiNx), or a multiple layer thereof may be disposed on the source electrode 150a and the drain electrode 150b.

A pixel electrode 170 and a common electrode 180 are disposed on the organic insulating film 160. The pixel electrode 170 is connected to the drain electrode 150b through the via hole 165 formed on the organic insulating film 160. The pixel electrode 160 is formed of a transparent and conductive material such as indium tin oxide (ITO) and indium zinc oxide (IZO). The common electrode 180 is made of the same material as the pixel electrode 170. The pixel electrode 170 and the common electrode 180 are arranged alternately and form a horizontal electric field between the pixel electrode 170 and the common electrode 180.

A top substrate 190 opposing the substrate 110 is disposed and a liquid crystal layer (LC) is interposed between the substrate 110 and the upper substrate 190. Exemplary embodiments of the present disclosure have been described with regard to an in-plane switching (IPS) liquid crystal display in which a pixel electrode 170 and a common electrode 180 are disposed on the same plane. However, the present disclosure is not limited to thereto, but instead the common electrode 180 may be disposed on the lower part of the pixel electrode 170 or the common electrode 180 may be disposed on the upper substrate 190.

Meanwhile, referring to FIG. 10, the display device of the present disclosure may be an organic light emitting display including an organic light emitting diode. More specifically, the organic insulating film 160 is positioned on the source electrode 150a and the drain electrode 150b. The organic insulating film 160 includes the via hole 165 exposing the drain electrode 150b.

The pixel electrode 170 is disposed on the organic insulating film 160. The pixel electrode 170 is connected to the drain electrode 150b through the via hole 165 on the organic insulating film 160. A bank layer 175 is disposed on the pixel electrode 170. The bank layer 175 may be a pixel definition layer that defines a pixel by exposing a part of the pixel electrode 170. An organic layer 190 is disposed on the bank layer 175 and the exposed pixel electrode 170. The organic layer 190 includes an emitting layer that emits light by the binding between electrons and holes, and may include a hole injection layer, a hole transport layer, an electron transport layer, or an electron injection layer. An opposing electrode 200 is disposed on a substrate 110 on which the organic film 190 is formed. The opposing electrode 200 is a cathode and may be made of magnesium (Mg), calcium (Ca), aluminum (Al), silver (Ag), or an alloy thereof having a low work function. Accordingly, an organic light emitting diode (OLED) including the pixel electrode 170, the organic layer 190, and the opposing electrode 200 is formed.

An encapsulation layer 210 is disposed on the substrate 110 on which the organic light emitting diode (OLED) is formed. The encapsulation layer 210 encapsulates the substrate 110, which includes the underlying organic light emitting diode (OLED), and may consist of an inorganic film, an organic film, or a multi-layer structure thereof. A cover window 220 is disposed on the encapsulation layer 210 and forms an organic light emitting display device.

Hereinafter, Experimental Examples with respect to an active layer including a first region and a second region according to embodiments of the present disclosure will be described. The following Experimental Examples are only exemplary embodiments of the present disclosure and the present disclosure is not limited thereto.

Experimental Example 1: Analysis of Active Layer Composition

Figure 11:
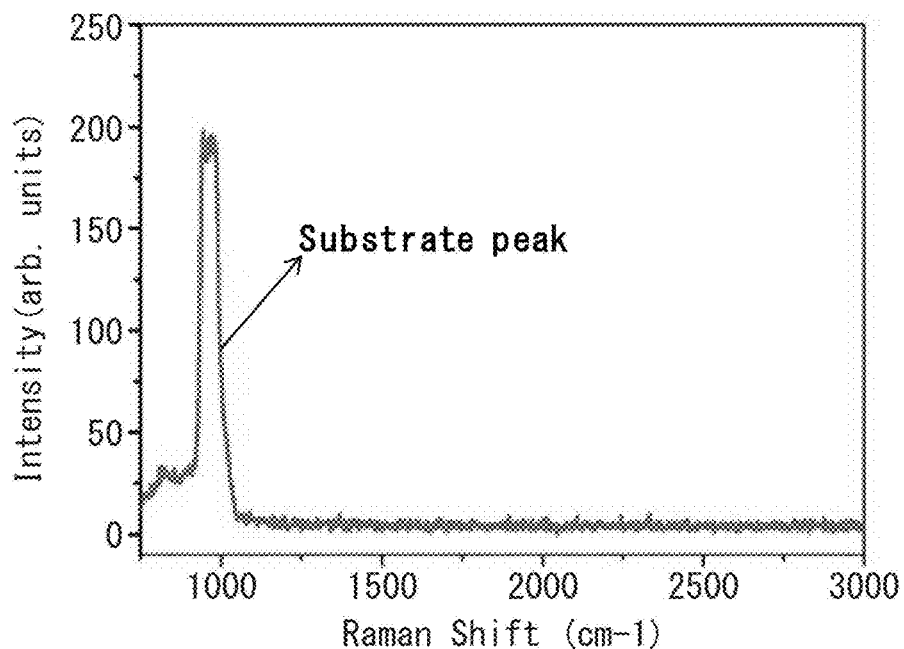
FIG. 11 shows a graph illustrating a result of Raman spectrum analysis of an active layer made of only an oxide semiconductor material.

The compositions of an active layer consisting of only an oxide semiconductor material and an active layer, in which an oxide semiconductor material and a carbon allotrope are mixed, were subjected to Raman spectral analysis. In particular, carbon nanotube was used as the carbon allotrope and 0.1 wt % of graphene was mixed based on 100 wt % of semiconductor material solids. FIG. 11 shows a graph illustrating a result of Raman spectrum analysis of an active layer made of only an oxide semiconductor material and FIG. 12 shows a graph illustrating a result of Raman spectrum analysis of an active layer in which an oxide semiconductor material and carbon nanotube are mixed.

Referring to FIG. 11, the Raman spectrum analysis result of an active layer consisting of only an oxide semiconductor material showed only the peak of a substrate in which an active layer was formed.

Figure 12:
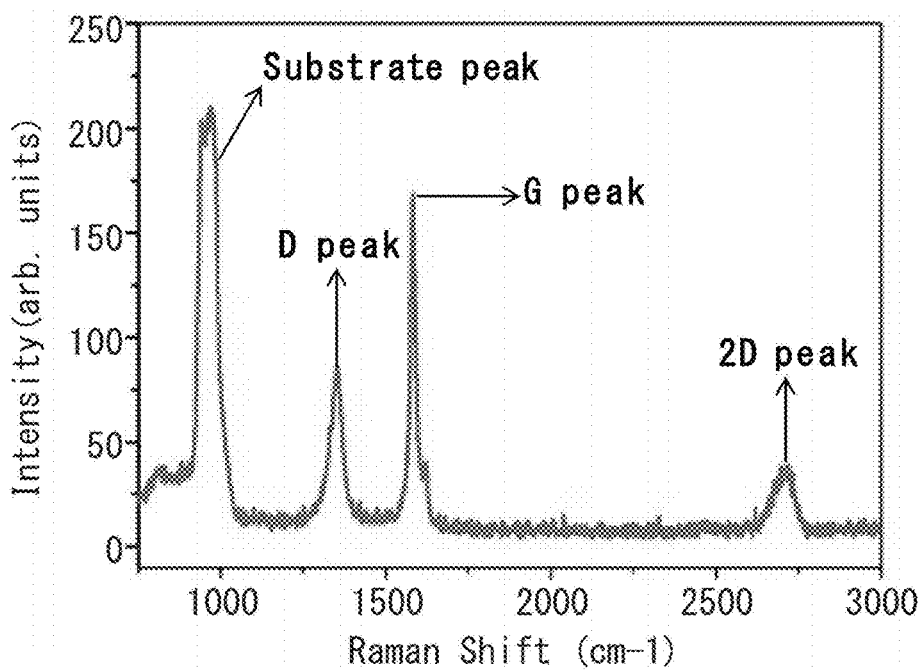
FIG. 12 shows a graph illustrating a result of Raman spectrum analysis of an active layer in which an oxide semiconductor material and carbon nanotubes are mixed.

Meanwhile, referring to FIG. 12, the Raman spectrum analysis result of an active layer, in which an oxide semiconductor material and carbon nanotube were mixed, showed G, D, 2D peaks in the presence of a carbon allotrope in addition to a substrate peak. Generally, when a carbon nanotube is present in a thin film, G peak, D peak, and 2D peak appear in Raman spectrum analysis. In particular, the position of the G peak is 1580 $cm^{-1}$, the position of the D peak is 1340 $cm^{-1}$, and the position of the 2D peak is 2700 $cm^{-1}$. G peak, which is called a G peak after 'g' of graphite, is a peak commonly found in graphite materials, and a D peak, being a peak due to a defect in the crystal, is a peak related to a defect of graphene or carbon nanotube. Since the 2D peak appears when the non-elastic scattering by the phonon having an energy of 1350 $cm^{-1}$ occurs twice consecutively, the 2D peak appears at around 2700 $cm^{-1}$. In D peaks, as the number of defects present in carbon nanotubes increases, the peak value increases. Accordingly, the result of Raman spectrum analysis based on the appearance of G, D, and 2D peaks confirmed the presence of carbon nanotube as the carbon allotrope.

Experimental Example 2: Evaluation of Thin-Film Transistors

Comparative Example 1

Pure IGZO was coated and heat-treated at 450° C. for 1 hour to form a coating layer, followed by patterning to form a single-layered active layer and a bottom gate-type thin film transistor was prepared.

Comparative Example 2

A thin film transistor was prepared under the same process conditions as in Comparative Example 1 described above, except that the active layer having a thickness of 20 nm was formed by mixing an IGZO solution with 0.1 wt % of carbon nanotube powder based on 100 wt % of IGZO solids.

Comparative Example 3

A thin film transistor was prepared under the same process conditions as in Comparative Example 2 described above, except that the active layer having a thickness of 5 nm was formed.

Example

A thin film transistor was manufactured under the same process conditions as in Comparative Example 1 described above, except that a thin active layer was formed by mixing an IGZO solution with 0.1 wt % of carbon nanotube powder based on 100 wt % of IGZO solids and an active layer having partially thicker portions was formed by performing an additional coating on the thin active layer. In particular, in the structure of FIG. 1, the first region was formed to have a thickness of 5 nm and the second region was formed to have a thickness of 10 nm.

Figure 13:
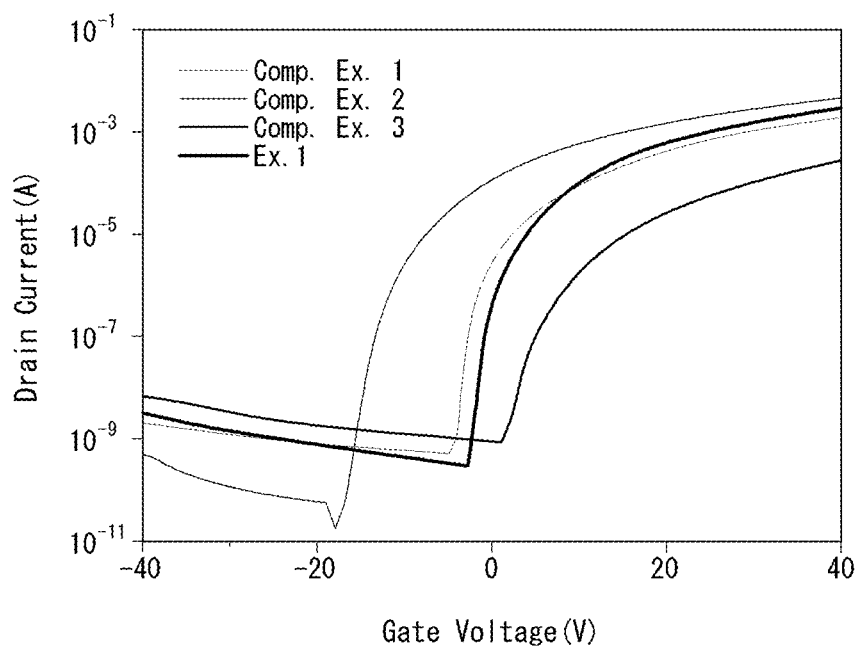
FIG. 13 shows a graph illustrating current-voltage curves of thin-film transistors manufactured according to Comparative Examples 1, 2, and 3 and Example.
Figure 14:
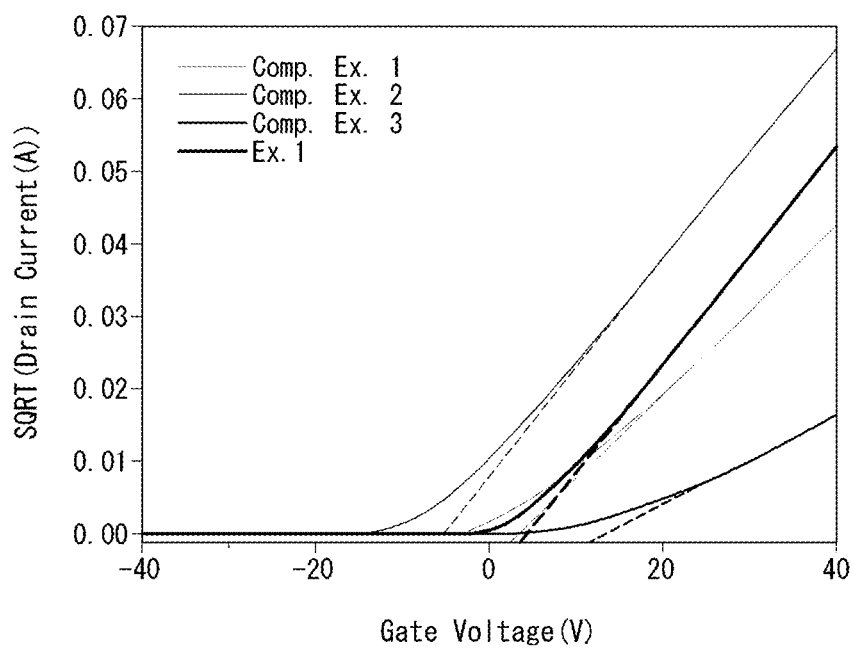
FIG. 14 shows a graph illustrating the SQRT-voltage representing a square root value of the drain current of FIG. 13.

The current-voltage curves of thin-film transistors manufactured according to Comparative Examples 1, 2, and 3 and Example were measured and shown in FIG. 13 and the SQRT-voltage representing the square root value of the drain current of FIG. 13 was measured and shown in FIG. 14. The threshold voltage and electron mobility are shown in Table 1 below.

TABLE 1

|  | Comparative Example 1 | Comparative Example 2 | Comparative Example 3 | Example |
|---|---|---|---|---|
| Threshold Voltage (Vth, V) | −0.5 | −9 | 6.1 | 2.2 |
| Electron Mobility ($cm^2$/Vs) | 3.3 | 10.4 | 0.86 | 8.4 |

Referring to FIG. 13, FIG. 14 and Table 1, in Comparative Example 1 where a single-layered active layer made of only IGZO was provided, the threshold voltage was shown to be −0.5 V and the electron mobility was shown to be 3.3 $cm^2$/Vs. In Comparative Example 2 where the single-layered active layer mixed with IGZO and carbon nanotube was provided, the threshold voltage was shown to be −9 V and the electron mobility was shown to be 10.4 $cm^2$/Vs. In Comparative Example 3 where the single-layered active layer, mixed with IGZO and carbon nanotube, having a thickness of 5 nm, the threshold voltage was shown to be 6.1 V and the electron mobility was shown to be 0.86 cm$^2$/Vs. Meanwhile, in Example where an active layer, which is mixed with IGZO and carbon nanotube and includes the first region having a thickness of 5 nm and the second region having a thickness of 10 nm, was provided, the threshold voltage was shown to be 2.2 V and the electron mobility was shown to be 8.4 cm$^2$/Vs.

From the above results, it was confirmed that in Comparative Example 1 where the single-layered active layer made of only IGZO was provided, the threshold voltage characteristic was good but the electron mobility was low. In Comparative Example 2 where the single-layered active layer mixed with IGZO and carbon nanotube was provided, the electron mobility was high but the threshold voltage was moved in the negative (−) direction and thus the characteristic was low. Additionally, in Comparative Example 3 where the single-layered active layer, mixed with IGZO and carbon nanotube, having a thickness of 5 nm, the electron mobility was very low and the threshold voltage moved significantly in the positive (+) direction. Meanwhile, in Example where an active layer, which is mixed with IGZO and carbon nanotube and includes the first region having a thickness of 5 nm and the second region having a thickness of 10 nm, was provided, the electron mobility was shown to be more rapid compared to those of Comparative Examples 1 and 3 and the threshold voltage was shown to be excellent compared to those of Comparative Examples 2 and 3.

Accordingly, the present disclosure can prevent the threshold voltage from moving in the negative direction by forming a thin first region and improve electron mobility by forming a thick second region. Therefore, the electron mobility and threshold voltage can be controlled by forming an active layer so that the channel region has different thicknesses.

It will be apparent to those skilled in the art that various modifications and variations can be made in the array substrate for a thin film transistor and the display device of the same of the present disclosure without departing from the technical idea or scope of the disclosure. Thus, it is intended that the present disclosure cover the modifications and variations of this disclosure provided they come within the scope of the appended claims and their equivalents

What is claimed is:

1. A thin-film transistor array substrate, comprising:
a substrate;
a gate electrode disposed on the substrate;
an active layer, which is opposite the gate electrode, has a first region and a second region having different thicknesses, and comprises at least a semiconductor material;
a gate insulating film interposed between the gate electrode and the active layer; and
a source electrode and a drain electrode, which are respectively in contact with the active layer,
wherein the active layer further comprises a plurality of carbon allotropes and the carbon allotropes are dispersed in the semiconductor material,
wherein the thickness of the first region is smaller than that of the second region, and
wherein a length of the second region is the same as or greater than a length of the first region in the channel region.

2. The thin-film transistor array substrate of claim 1, wherein:

the active layer comprises a channel region; and
the first and second regions completely overlap with the channel region.

3. The thin-film transistor array substrate of claim 1, wherein:
the first region is adjacent to any one selected from the source electrode and the drain electrode; and
the second region is adjacent to the other selected from the source electrode and the drain electrode.

4. The thin-film transistor array substrate of claim 1, wherein the thickness of the first region is in a range of 3 nm to 10 nm.

5. The thin-film transistor array substrate of claim 4, wherein the thickness of the second region is 1.5 times to 3 times of the thickness of the first region.

6. The thin-film transistor array substrate of claim 1, wherein the length of the second region is 50% to 90% based on that of the channel region.

7. The thin-film transistor array substrate of claim 1, wherein the carbon allotropes have a one-dimensional structure or two-dimensional structure.

8. The thin-film transistor array substrate of claim 1, wherein the carbon allotrope is one selected from the group consisting of reduced graphene oxide (rGO), nonoxidized graphene, graphene nanoribbon, carbon nanotube (CNT), or a mixture thereof.

9. The thin-film transistor array substrate of claim 1, wherein the semiconductor material is one selected from the group consisting of a ceramic semiconductor, an organic semiconductor, a transition metal chalcogenide, and an oxide semiconductor, or a mixture thereof.

10. The thin-film transistor array substrate of claim 1, wherein the carbon allotropes in the first active layer are comprised in an amount of 0.01 wt % to 1 wt % based on 100 wt % of the semiconductor material.

11. A display device, comprising:
a substrate;
a gate electrode disposed on the substrate;
an active layer, which is opposite the gate electrode, has a first region and a second region having different thicknesses, and comprises at least a semiconductor material;
a gate insulating film interposed between the gate electrode and the active layer;
a source electrode and a drain electrode, which are respectively in contact with the active layer;
an organic insulating film, which is disposed on the source electrode and the drain electrode; and
a pixel electrode disposed on the organic insulating film,
wherein the active layer further comprises a plurality of carbon allotropes and the carbon allotropes are dispersed in the semiconductor material,
wherein the thickness of the first region is smaller than that of the second region, and
wherein a length of the second region is the same as or greater than a length of the first region in the channel region.

12. The display device of claim 11, further comprising:
an organic light emitting diode electrically connected to the pixel electrode;
an encapsulation layer disposed on the organic light emitting diode; and
a cover window disposed on the encapsulation layer.

13. The display device of claim 11, further comprising:
a common electrode, which is disposed to be spaced apart from the pixel electrode on the same plane or a lower part thereof; and
a liquid crystal layer disposed on the common electrode.

* * * * *